(12) United States Patent
Tey et al.

(10) Patent No.: US 11,217,511 B2
(45) Date of Patent: Jan. 4, 2022

(54) QUAD PACKAGE WITH CONDUCTIVE CLIPS CONNECTED TO TERMINALS AT UPPER SURFACE OF SEMICONDUCTOR DIE

(71) Applicant: Infineon Technologies AG, Neubiberg (DE)

(72) Inventors: Sock Chien Tey, Melaka (MY); Chan Lam Cha, Melaka (MY); Hoe Jian Chong, Melaka (MY); Cher Hau Danny Koh, Malacca (MY); Kim Guan Tan, Melaka (MY); Mei Yong Wang, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 99 days.

(21) Appl. No.: 16/379,405

(22) Filed: Apr. 9, 2019

(65) Prior Publication Data

US 2020/0328140 A1 Oct. 15, 2020

(51) Int. Cl.
| | |
|---|---|
| *H01L 23/495* | (2006.01) |
| *H01L 23/00* | (2006.01) |
| *H01L 21/56* | (2006.01) |
| *H01L 23/31* | (2006.01) |

(52) U.S. Cl.
CPC ........ *H01L 23/49562* (2013.01); *H01L 21/56* (2013.01); *H01L 23/3107* (2013.01); *H01L 23/49503* (2013.01); *H01L 23/49517* (2013.01); *H01L 24/40* (2013.01); *H01L 24/48* (2013.01); *H01L 24/73* (2013.01); *H01L 24/84* (2013.01); *H01L 2224/48227* (2013.01); *H01L 2224/48245* (2013.01); *H01L 2224/73221* (2013.01); *H01L 2224/73263* (2013.01); *H01L 2224/73265* (2013.01)

(58) Field of Classification Search
CPC ..... H01L 2224/73221; H01L 23/49537; H01L 24/38
See application file for complete search history.

(56) References Cited

U.S. PATENT DOCUMENTS

| | | | |
|---|---|---|---|
| 7,786,555 B2 * | 8/2010 | Xiaochun | H01L 23/4334 257/675 |
| 9,165,866 B2 * | 10/2015 | Yilmaz | H01L 24/84 |
| 9,711,484 B2 * | 7/2017 | Paek | H01L 24/81 |

(Continued)

*Primary Examiner* — Daniel Luke
(74) *Attorney, Agent, or Firm* — Murphy, Bilak & Homiller, PLLC

(57) ABSTRACT

A packaged semiconductor device includes a carrier having a die attach surface, a semiconductor die mounted on the die attach surface and comprising first and second conductive terminals disposed on an upper side, a first clip that extends over the semiconductor die and is electrically connected to the first conductive terminal, a second clip that extends over the semiconductor die and is electrically connected to the second conductive terminal, and an electrically insulating encapsulant body that encapsulates the semiconductor die. An outer end of the first clip is exposed from the encapsulant body and provides a point of external electrical contact for the first conductive terminal. An outer end of the second clip is exposed from the same or a different side face of the encapsulant body as the first clip and provides a point of external electrical contact for the second conductive terminal.

27 Claims, 10 Drawing Sheets

(56) References Cited

U.S. PATENT DOCUMENTS

| | | |
|---|---|---|
| 2007/0090523 A1 | 4/2007 | Otremba |
| 2008/0105957 A1 | 5/2008 | Joshi et al. |
| 2009/0160067 A1 | 6/2009 | Bayan |
| 2017/0033055 A1* | 2/2017 | Watanabe ......... H01L 23/49524 |
| 2017/0236773 A1 | 8/2017 | Chi et al. |
| 2019/0103342 A1* | 4/2019 | Neugirg ................. H01L 21/50 |

* cited by examiner

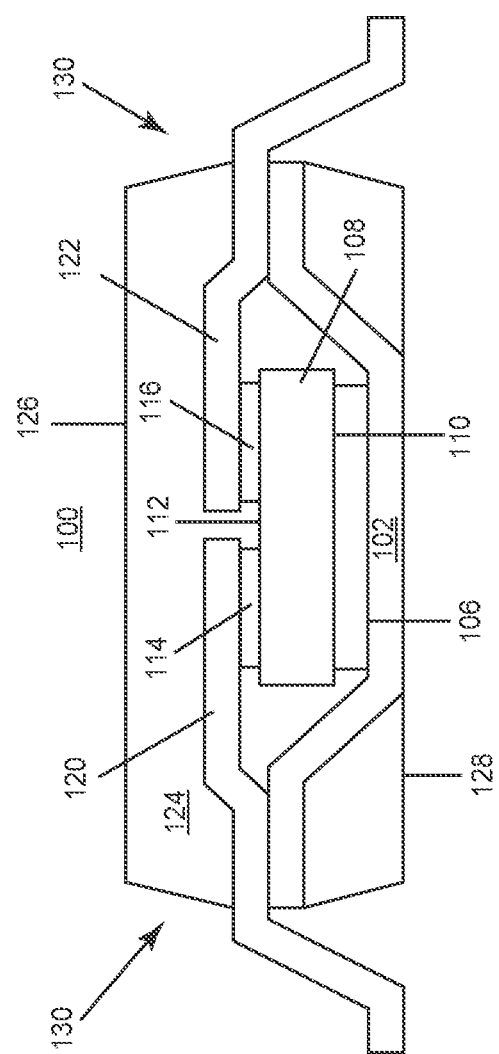
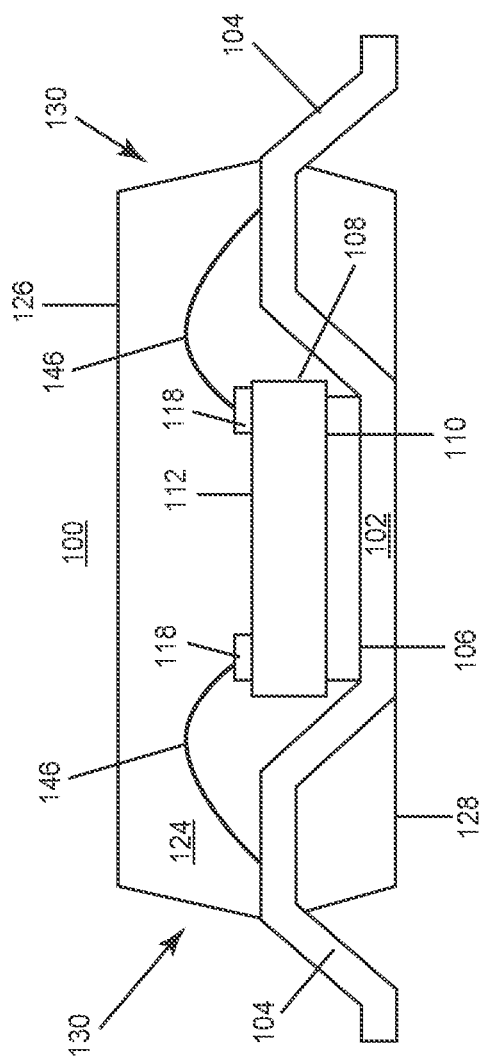

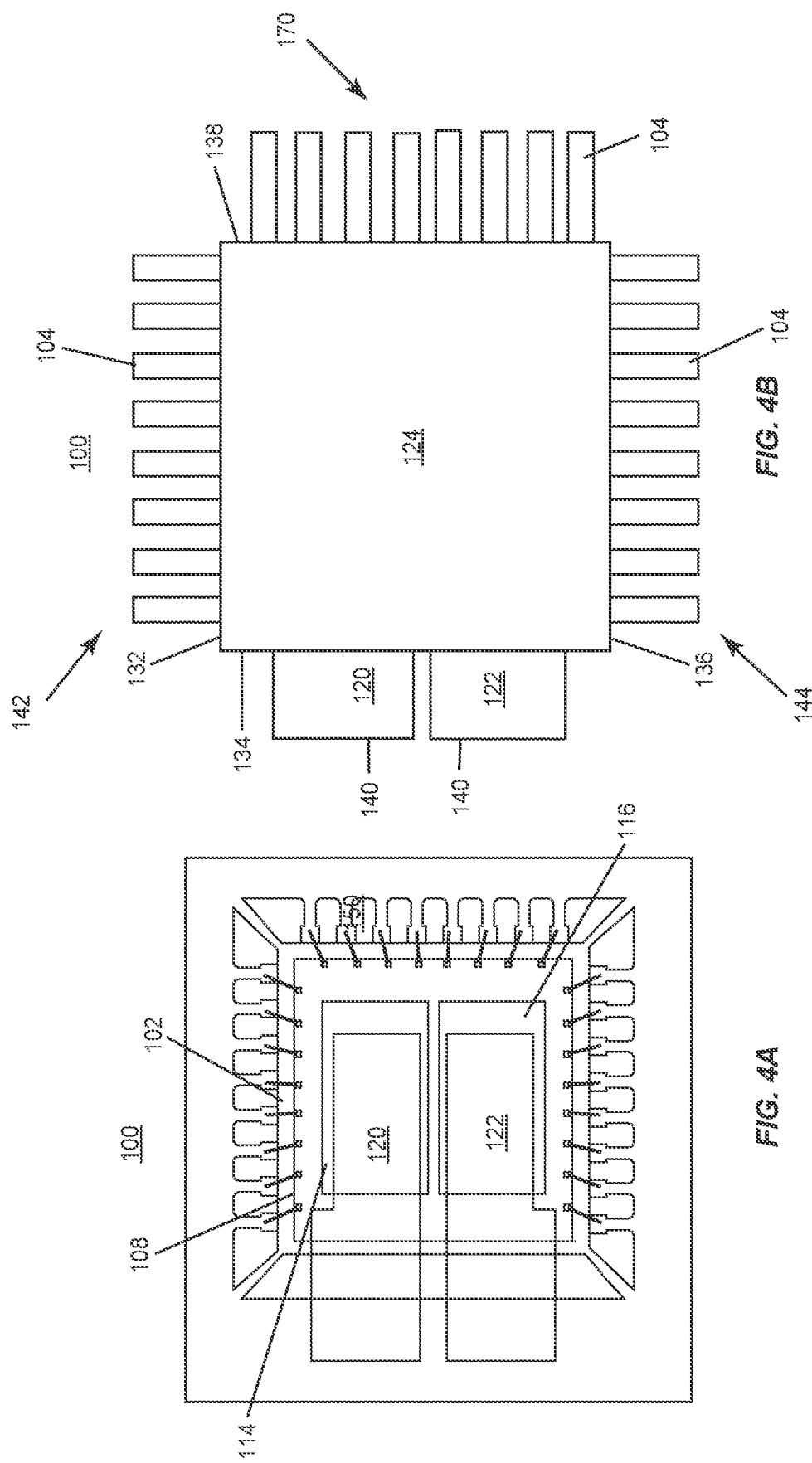

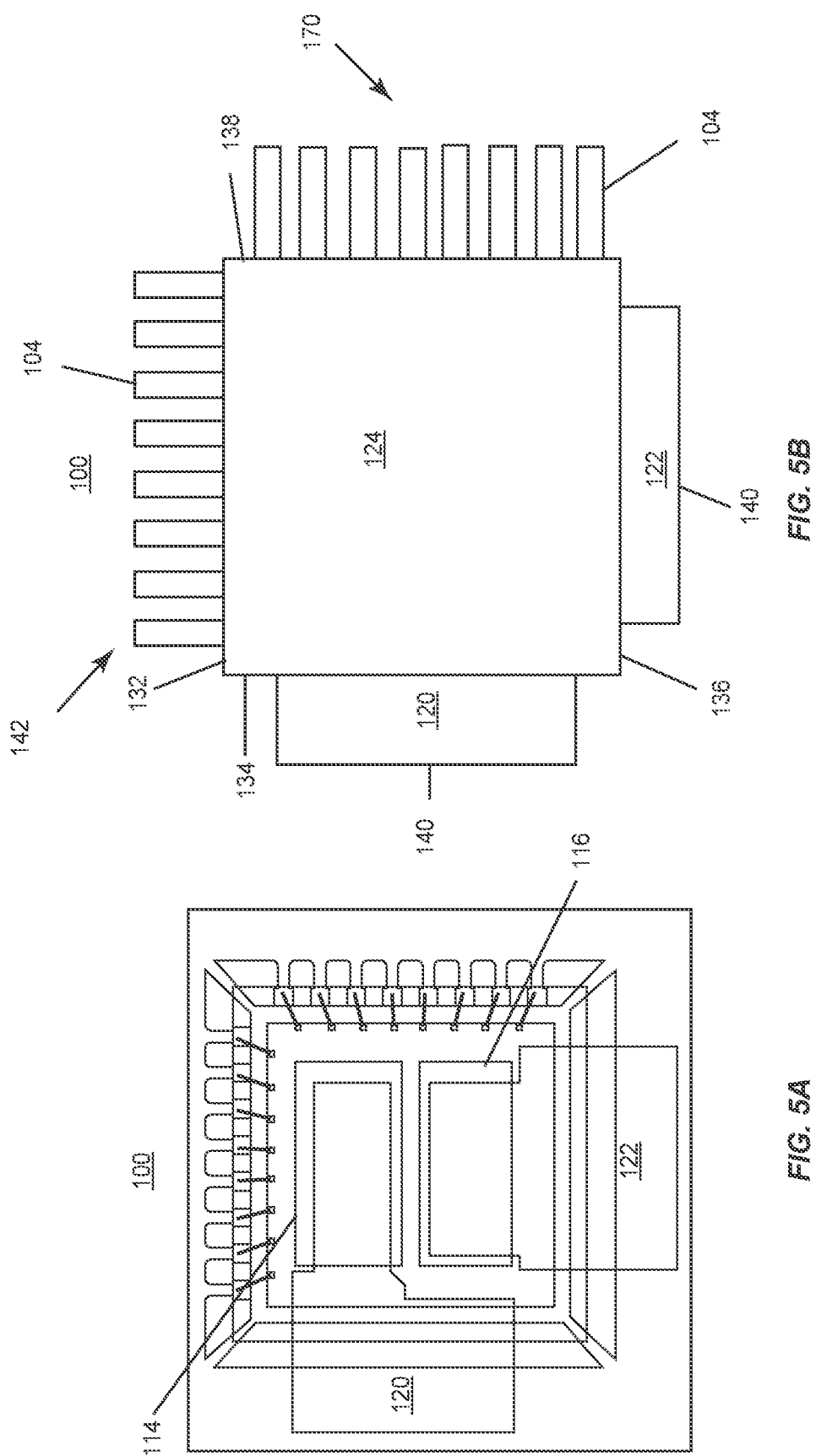

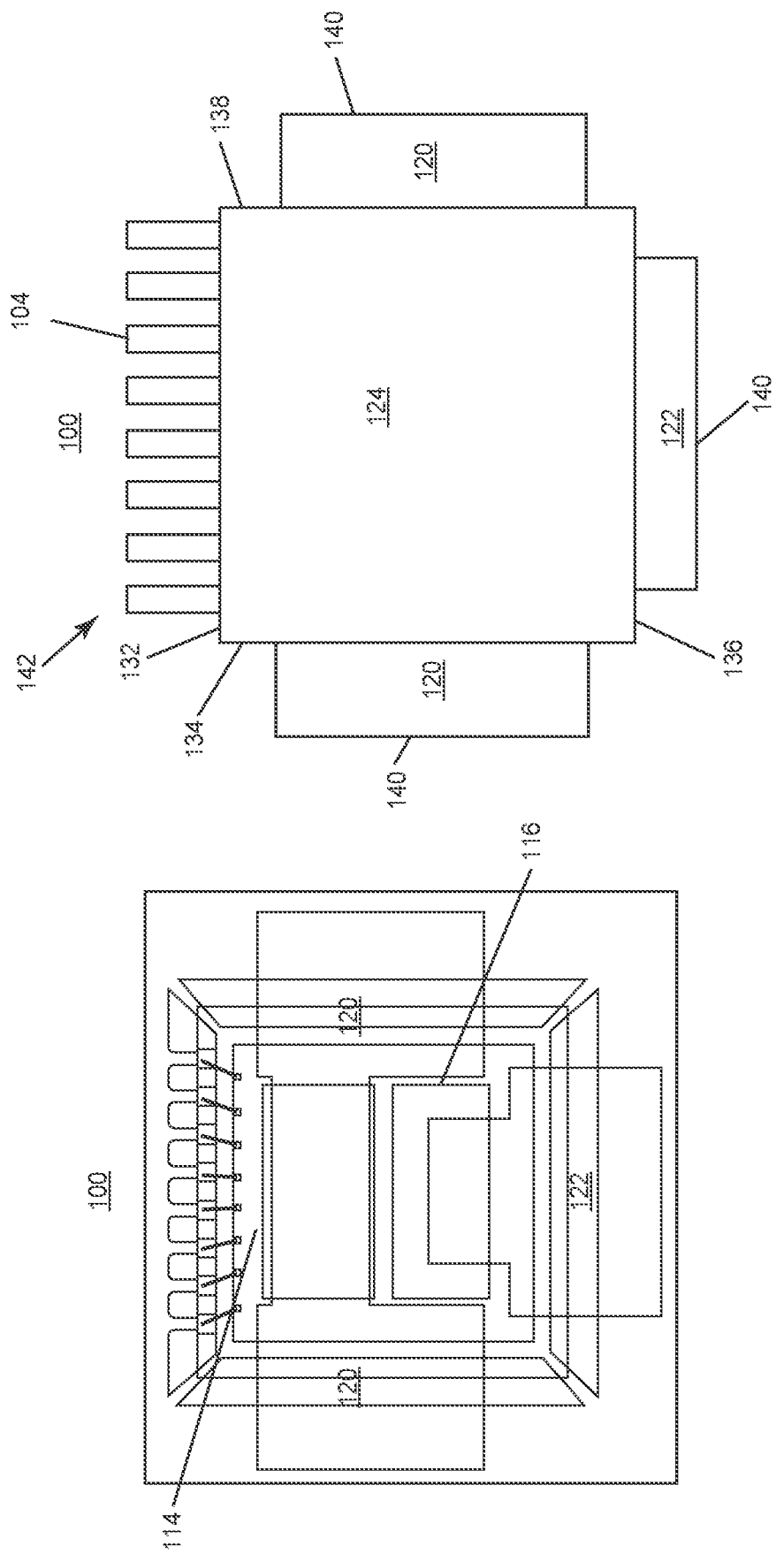

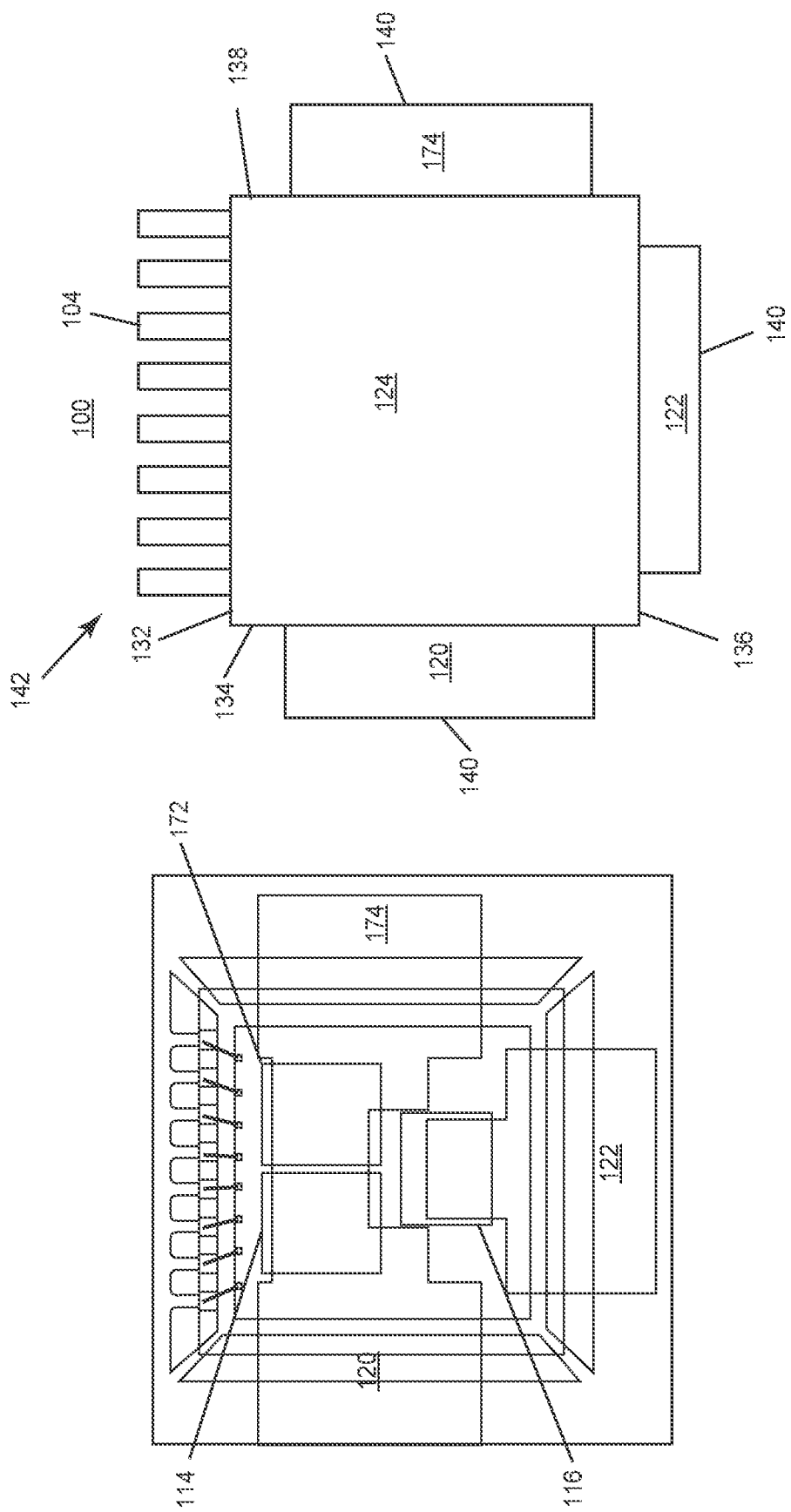

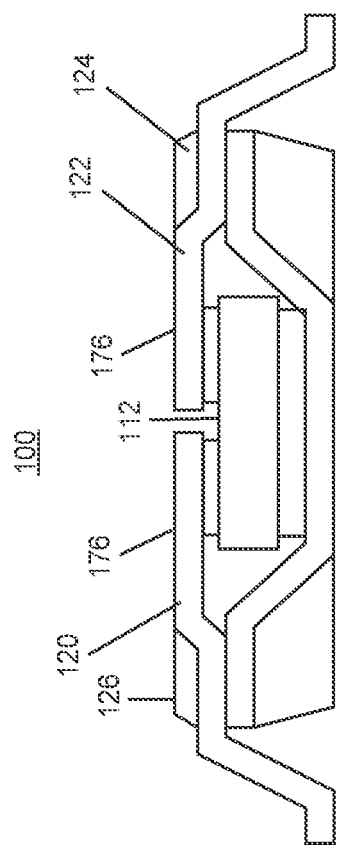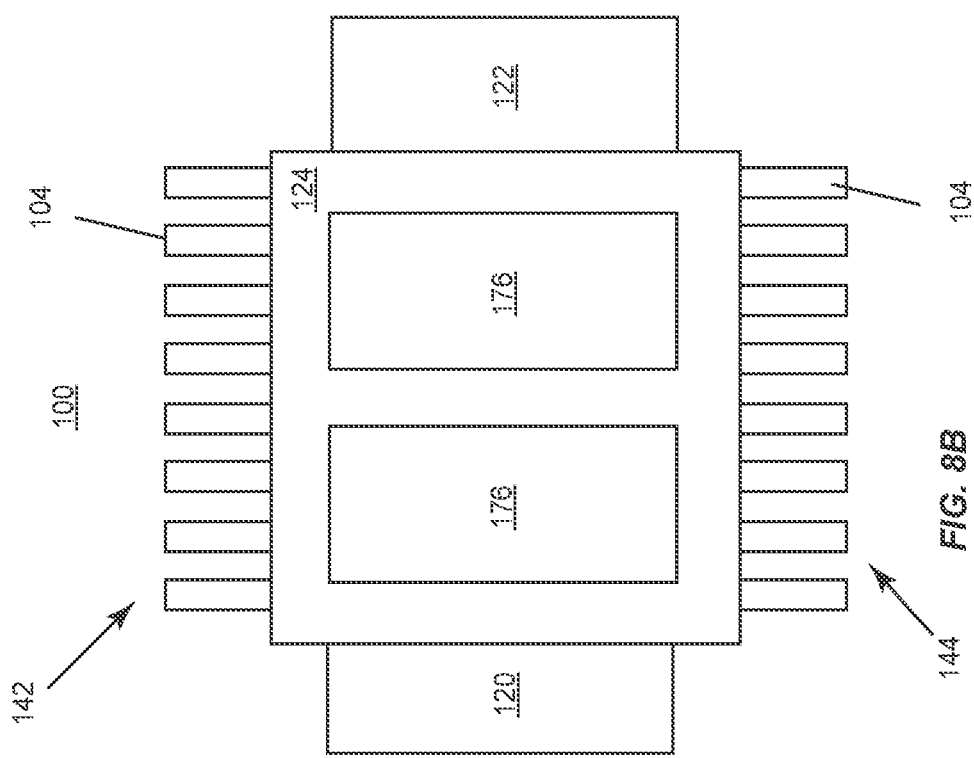
FIG. 8A
FIG. 8B

QUAD PACKAGE WITH CONDUCTIVE CLIPS CONNECTED TO TERMINALS AT UPPER SURFACE OF SEMICONDUCTOR DIE

TECHNICAL FIELD

Embodiments of this invention relate to a semiconductor package and a method of producing a semiconductor package.

BACKGROUND

Semiconductor packages are commonly used to provide connective compatibility between a semiconductor die and an external apparatus, such as a printed circuit board (PCB). Additionally, semiconductor packages protect the semiconductor die from potentially damaging environmental conditions, such as temperature variations, moisture, dust particles, etc.

Power applications that require high voltage and/or current switching have special design requirements with respect to the design of the semiconductor package. Power semiconductor packages should provide low resistance electrical connections between the semiconductor die and the external terminals. Moreover, power semiconductor packages should be designed to accommodate high temperature operation, which may induce thermal expansion of the package materials. Conventional solutions for managing these high currents and high temperatures include shortening bond wire lengths and using fused leads. However, these solutions are reaching practical limitations in modern power applications. Moreover, fused lead designs reduce the I/O (input output) count for a given size package.

Thus, there is a need for a power semiconductor package with high current carrying capability, low thermal resistance and high I/O count within a small package footprint.

SUMMARY

A packaged semiconductor device is disclosed. According to an embodiment, the packaged semiconductor device includes a carrier comprising a die attach surface, a semiconductor die mounted on the die attach surface and comprising first and second conductive terminals disposed on an upper side of the semiconductor die that is opposite from the carrier, a first clip that extends over the upper side of the semiconductor die and is electrically connected to the first conductive terminal, a second clip that extends over the upper side of the semiconductor die and is electrically connected to the second conductive terminal, and an electrically insulating encapsulant body that encapsulates the semiconductor die. An outer end of the first clip is exposed from a side face of the encapsulant body and provides a point of external electrical contact for the first conductive terminal. An outer end of the second clip is exposed from the same or a different side face of the encapsulant body as the outer end of the first clip and provides a point of external electrical contact for the second conductive terminal.

Separately or in combination, the packaged semiconductor device further comprises a plurality of first conductive leads that each extend away from a first side of the carrier, and the first clip is oriented transversely relative the first conductive leads.

Separately or in combination, the semiconductor die further comprises a plurality of additional conductive terminals disposed on the upper side, the packaged semiconductor device further comprises conductive connectors that electrically connect each of the additional conductive terminals respectively to one of the first leads, and the first clip is oriented transversely relative the conductive connectors.

Separately or in combination, the encapsulant body comprises an upper surface that extends over the upper side of the semiconductor die, a lower surface opposite the upper surface, and first and second side faces that extend between the upper and lower surfaces, the first and second side faces form an angled intersection with one another, each of the first leads protrude out of the first side face, and the first clip protrudes out of the second side face.

Separately or in combination, the second clip protrudes out of the second side face of the encapsulant body.

Separately or in combination, the encapsulant body comprises third and fourth side faces that each extend between the upper and lower surfaces, the first, second, third and fourth side faces collectively form a rectangle, and the second clip protrudes out of the third or fourth side faces of the encapsulant body.

Separately or in combination, the packaged semiconductor device further includes a plurality of second conductive leads that each extend away from a second side of the carrier in an opposite direction as the first conductive leads, each of the second conductive leads protrude out of the third side face of the encapsulant body, and the second clip protrudes out of the fourth side face of the encapsulant body.

Separately or in combination, the first clip protrudes out of the second and fourth side faces of the encapsulant body, and the third clip protrudes out of the third side face of the encapsulant body.

Separately or in combination, the packaged semiconductor device further comprises a plurality of third conductive leads that each face and extend away from a third edge side of the carrier, the third conductive leads extend perpendicularly to the first conductive leads, each of the third leads protrude out of the fourth side face of the encapsulant body, and the second clip protrudes out of the third side face of the encapsulant body.

Separately or in combination, the semiconductor die further comprises a third conductive terminal disposed on the upper side, the packaged semiconductor device further comprises a third clip that extends over the upper side of the semiconductor die and is electrically connected to the third conductive terminal, and the third clip protrudes out of the fourth side face of the encapsulant body.

Separately or in combination, upper surfaces of the first and second clips that face away from the upper surface of the semiconductor die are completely covered by encapsulant material of the encapsulant body.

Separately or in combination, upper surfaces of the first and second clips that face away from the upper surface of the semiconductor die are exposed from encapsulant material of the encapsulant body.

Separately or in combination, the semiconductor die comprises first and second switching devices integrated therein, each of the first and second switching devices comprise a control terminal, a first output terminal, and a second output terminal, the first conductive terminal is a bond pad connection to the first output terminal of the first switching device, and the second conductive terminal is a bond pad connection to the first output terminal of the second switching device.

Separately or in combination, the first output terminal of the first switching device and the first output terminal of the second switching device are each drain terminals, wherein the second output terminal of the first switching device and the second output terminal of the second switching device are each source terminals, and wherein the second output terminal of the first switching device and the second output terminal of the second switching device each directly face and electrically connect with the carrier.

According to another embodiment, the packaged semiconductor device includes a carrier comprising a die attach surface, a semiconductor die mounted on the die attach surface, an electrically insulating encapsulant body that encapsulates the semiconductor die, and first and second clips that are partially exposed from the electrically insulating encapsulant body and extend over an upper side of the semiconductor die that is opposite from the carrier. The semiconductor die comprises first and second switching devices integrated therein. Each of the first and second switching devices comprise a control terminal, a first output terminal, and a second output terminal, the first clip is electrically connected to the first output terminal of the first switching device via a bond pad connection at the upper surface. The second clip is electrically connected to the first output terminal of the second switching device via a bond pad connection at the upper surface.

Separately or in combination, the packaged semiconductor device further comprises a plurality of first conductive leads that protrude out of a different side face of the encapsulant body as the first and second clips, and electrical connectors connecting the first conductive leads to additional terminals disposed on the upper surface of the semiconductor die, the first leads provide separate points of external electrical contact for the control terminals of the first and second switching devices, and at least the first clip is oriented transversely relative to the first conductive leads and is oriented transversely relative to the electrical connectors.

A method of forming a packaged semiconductor device is disclosed. According to an embodiment, the method includes providing a carrier comprising a die attach surface, mounting a semiconductor die on the die attach surface such that first and second conductive terminals disposed on an upper side of the semiconductor die that are opposite from the carrier, providing a first clip that extends over the upper side of the semiconductor die and is electrically connected to the first conductive terminal, providing a second clip that extends over the upper side of the semiconductor die and is electrically connected to the second conductive terminal, and providing an electrically insulating encapsulant body that encapsulates the semiconductor die. Outer ends of the first and second clips are exposed from the encapsulant body.

Separately or in combination, the method further includes providing a plurality of first conductive leads that each extend away from a first edge side of the carrier, and attaching the first clip to the first conductive terminal such that the first clip is oriented transversely relative the first conductive leads.

Separately or in combination, the semiconductor die further comprises a plurality of additional conductive terminals disposed on the upper side, and the method further comprises providing conductive connectors that electrically connect each of the additional conductive terminals respectively to one of the first leads and attaching the first clip to the first conductive terminal such that the first clip is oriented transversely relative the conductive connectors.

Separately or in combination, providing the encapsulant body comprises completely covering upper surfaces of the first and second clips that face away from the upper surface of the semiconductor die with encapsulant material of the encapsulant body.

Separately or in combination, the method further comprises, after completely covering the upper surfaces of the first and second clips, removing encapsulant material from the encapsulant body such that the upper surfaces of the first and second clips are exposed and coplanar with an upper surface of the encapsulant body.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1-2, which includes FIGS. 1A, 1B, 2A and 2B, illustrate a semiconductor package, according to an embodiment.

FIG. 4, which includes FIGS. 4A and 4B, illustrates a semiconductor package, according to another embodiment.

FIG. 5, which includes FIGS. 5A and 5B, illustrates a semiconductor package, according to another embodiment.

FIG. 6, which includes FIGS. 6A and 6B, illustrates a semiconductor package, according to another embodiment.

FIG. 7, which includes FIGS. 7A and 7B, illustrates a semiconductor package, according to another embodiment.

FIG. 8, which includes FIGS. 8A and 8B, illustrates a semiconductor package, according to another embodiment.

FIG. 9, which includes

FIG. 10, which includes

DETAILED DESCRIPTION

The embodiments described herein provide a packaged semiconductor device with an advantageous multi-channel clip configuration. In one exemplary embodiment, the packaged semiconductor device includes a power semiconductor die (e.g., a 200V or more rated power MOSFET) and two or more conductive clips that electrically connect with conductive terminals on an upper side of the power semiconductor die. These clips continuously extend from the semiconductor die through side faces of the encapsulant body to provide a point of external electrical contact for the conductive terminals of the die. In addition to the clips, the packaged semiconductor device includes conductive leads that provide additional points of external electrical contact for terminals of the semiconductor die. The clips are oriented transversely relative to the leads and associated wire bonds between the die and leads. As a result of this design, the clips provide dedicated low resistance connections for high current channels (e.g., drain outputs of MOSFET devices) and create additional I/O capacity for the leads.

Figure 2B:
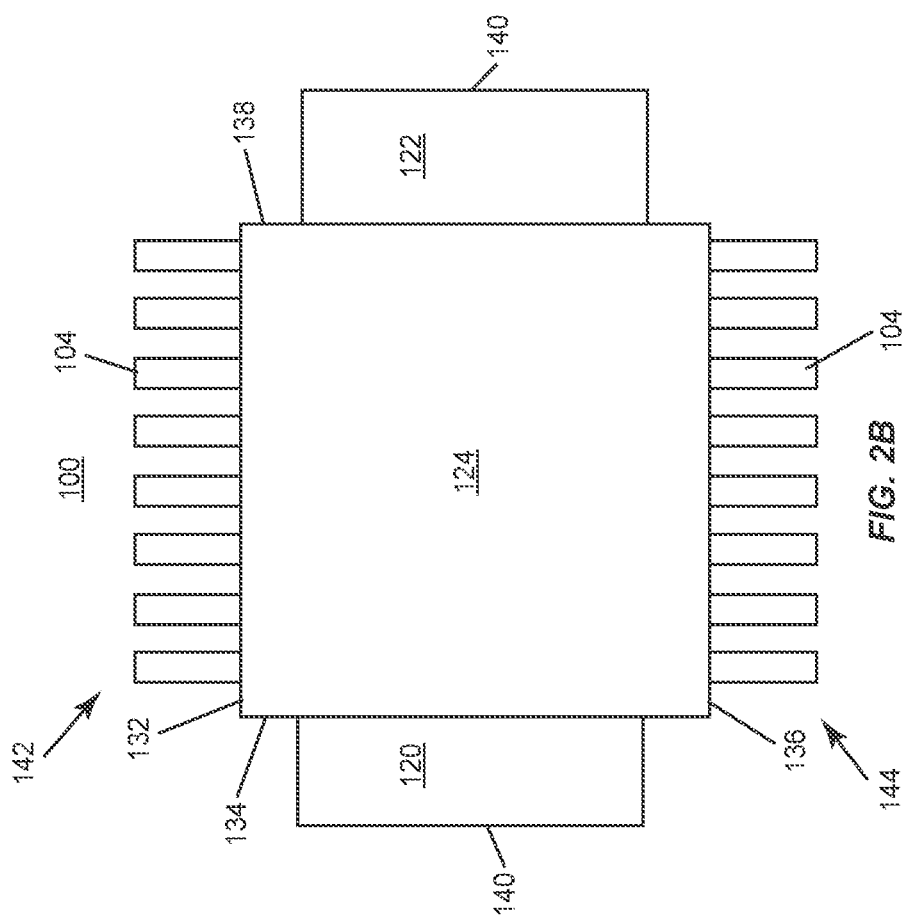
Figure 2A:
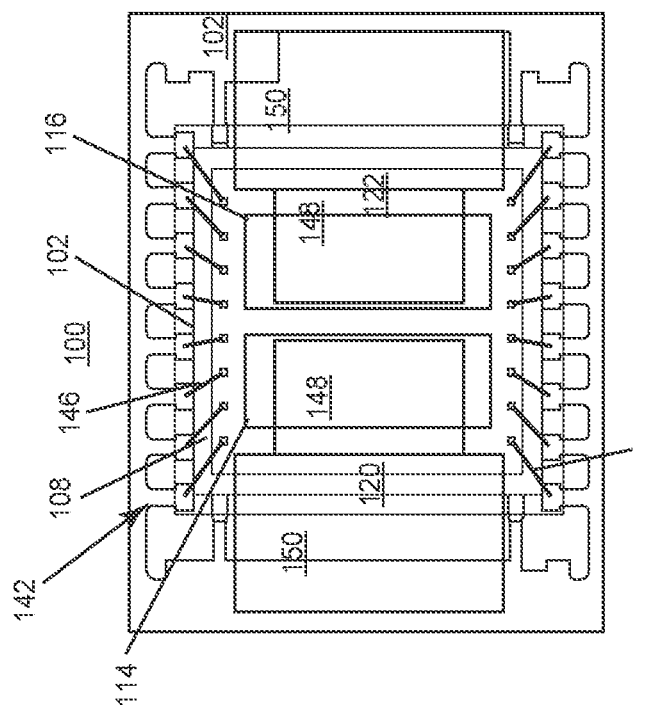

FIGS. 1A, 1B, 2A and 2D illustrate an embodiment of a semiconductor package 100. FIG. 1A shows the completed semiconductor package 100 from a cross-sectional perspective. FIG. 1B shows the completed semiconductor package 100 from a second cross-sectional perspective that is rotated 90 degrees relative to the cross-sectional perspective of FIG. 1A. FIG. 2A shows a plan view of the semiconductor package 100 during assembly and without encapsulant material. FIG. 2B shows a plan view of the completed semiconductor package 100.

The semiconductor package 100 includes a carrier structure. In this embodiment, the carrier structure is implemented as a lead frame, which includes a centrally located die paddle 102 and a plurality of electrically conductive leads 104 that extend away from the die paddle 102. The die paddle 102 includes a planar die attach surface 106 that accommodates the mounting of one or more semiconductor dies thereon. Generally speaking, the carrier structure including the die paddle 102 and the leads 104 can include conductive metals, such as copper, aluminum, etc., and alloys thereof. In the depicted embodiment, the lead frame has a downset configuration, wherein the die paddle 102 is vertically offset below the leads 104. In other embodiments, the die paddle 102 and the leads 104 are coplanar or close to coplanar with one another.

A semiconductor die 108 is mounted on the die attach surface 106 of the carrier. The semiconductor die 108 is mounted with a rear side 110 of the semiconductor die 108 facing and attached to the die attach surface 106, and an upper side 112 of the semiconductor die 108 facing away from the carrier. As shown in FIG. 1A, the upper side 112 of the semiconductor die 108 includes first and second conductive terminals 114, 116. As shown in FIG. 1B, the upper side 112 of the semiconductor die 108 includes additional conductive terminals 118. These additional conductive terminals 118 are distinct terminals for I/O terminals of the devices incorporated into the semiconductor die 108. According to an embodiment, each of the conductive terminals 114, 116, 118 are electrically conductive bond pads.

The semiconductor package 100 includes first and second conductive clips 120, 122. The first and second conductive clips 120, 122 each extend over the upper side 112 of the semiconductor die 108. Hence, the first and second conductive clips 120, 122 are arranged on an opposite side of the semiconductor die 108 as the carrier. The first conductive clip 120 is attached to and electrically connected with the first conductive terminal 114. The second conductive clip 122 is attached to and electrically connected with the second conductive terminal 116. This connection can be effectuated using a conductive adhesive, e.g., solder, sinter, conductive glue, conductive, tape, etc. Optionally, intermediary structures, e.g., solder balls, pillars, etc., may be provided between the clips and the conductive terminals.

The semiconductor package 100 includes an electrically insulating encapsulant body 124. The material of the encapsulant body 124 is formed to completely encapsulate, i.e., cover and surround, the semiconductor die 108 and associated electrical connections to terminals of the semiconductor die 108.

The encapsulant body 124 includes opposite facing upper and lower surfaces 126, 128. In the depicted embodiment, the upper surface 126 of the encapsulant body 124 extends over and is spaced apart from upper surfaces of the first and second conductive clips 120, 122. Thus, the upper surfaces of the first and second conductive clips 120, 122 are completely covered by encapsulant material of the encapsulant body 124. In the depicted embodiment, the lower surface 128 of the encapsulant body 124 is coplanar with a lower side of the carrier. As a result, the lower side of the carrier is exposed from the encapsulant body 124 and may provide an electrical terminal and/or heat sink interface. In other embodiments, the lower side of the carrier may be covered with encapsulant material.

The encapsulant body 124 includes side faces 130 that vertically extend between the upper and lower surfaces 126, 128 of the encapsulant body 124. In the depicted embodiments, each side face 130 includes two angled faces that are non-perpendicular to the upper and lower sides, respectively. That is, the side face 130 has a slight V shape in the vertical direction. Alternatively, the side faces 130 can be perpendicular to the upper and lower surfaces 126, 128. According to an embodiment, the encapsulant body 124 includes first and second side faces 132, 134 (as shown in FIG. 2B) that form an angled intersection with one another. This means that, from a plan-view perspective of the encapsulant body 124, the first and second side faces 132, 134 extend in different directions and meet one another at a corner of the encapsulant body 124. For example, in each of the depicted embodiments, the encapsulant body 124 includes first, second, third and fourth side faces 132, 134, 136 and 138 that collectively form a rectangle. That is, when seen from a plan-view perspective (e.g., as shown in FIG. 2B), the first side face 132 intersects the second side face 134 at a ninety-degree angle, the second side face 134 intersects the third side face 136 at a ninety-degree angle, and so forth. More generally, the side faces of the encapsulant body 124 can be configured in any of variety enclosed geometries, including enclosed geometries that include acute and obtuse angles.

Outer ends 140 of the first and second conductive clips 120, 122 are exposed from the encapsulant body 124. As a result, an outer end 140 of the first conductive clip 120 provides a point of external electrical contact for the first conductive terminal 114. Likewise, an outer end 140 of the second conductive clip 122 provides a point of external electrical contact for the second conductive terminal 116. The outer end 140 of the second conductive clip 122 may be exposed from the same or a different side face 130 of the encapsulant body 124 as the outer end 140 of the first conductive clip 120. For example, in the embodiment of FIGS. 1-2, the first conductive clip 120 protrudes out of the second side face 134 of the encapsulant body 124 and the second conductive clip 122 protrudes out of the fourth side face 138 of the encapsulant body 124. Hence, the outer end 140 of the second conductive clip 122 is exposed from a different side face 130 (the fourth side face 138) of the encapsulant body 124 than the side face 130 of the encapsulant body 124 that the outer end 140 of the second conductive clip 122 is exposed from (the second side face 134).

As shown, the first and second conductive clips 120, 122 are bent in several locations such that the outer ends 140 of these clips are coplanar with the lower surface 128 of the encapsulant body 124, thereby providing a similar geometry as a so-called gull wing style lead configuration. More generally, the first and second conductive clips 120, 122 can be configured to provide any of a variety of package terminal configurations, such as surface mount configurations, through hole configurations, leadless configurations, etc.

The semiconductor package 100 includes plurality of first conductive leads 142 that each extend away from a first side of the carrier and protrude out of the first side face 132 of the encapsulant body 124. Additionally, the semiconductor package 100 includes plurality of second conductive leads 144 that each extend away from a second side of the carrier and protrude out of the third side face 136 of the encapsulant body 124. Hence, the first and second conductive leads 142, 144 extend away from the carrier in opposite directions. The first and second conductive second leads 142, 144 may be provided as part of a lead frame structure. An example of an untrimmed lead frame structure is shown in FIG. 2A. The first and second conductive second leads 142, 144 are electrically connected to the additional conductive terminals 118 disposed on the upper side 112 of the semiconductor die 108. Hence, the outer ends of the first and second conductive second leads 142, 144 provide external access points to distinct terminals of the semiconductor die 108 in a similar manner as the clips as described above. The semiconductor package 100 includes conductive connectors 146 extending between the additional terminals and individual ones of the leads 104 to provide the necessary electrical connection. As shown, these conductive connectors 146 are provided by electrically conductive bond wires. More generally, these conductive connectors 146 can include any of a variety of known connectors, e.g., clips, ribbons, etc.

According to an embodiment, at least the first conductive clip 120 is oriented transversely relative the first conductive leads 142. As used herein, "oriented" refers to a current flow direction of the elements. Hence, two conductive elements that are oriented "transversely" relative to one another conduct current in non-parallel, i.e., intersecting, directions. In the depicted embodiment, current of the first conductive clip 120 flows in a direction that is parallel to the first side face 132, and perpendicular to the second side face 134. Conversely, current of the first conductive leads 142 flows in a direction that is parallel to the second side face 134, and perpendicular to the first side face 132. Hence, the first conductive clip 120 and the first leads are oriented perpendicular to one another within the meaning of "oriented" as used herein.

According to an embodiment, at least the first conductive clip 120 is oriented transversely relative to the conductive connectors 146. By orienting at least some of the clips to be transverse with at least some of the leads 104 and the conductive connectors 146, a space-efficient design is achieved. This is because the package design uses every available direction in the two-dimensional plane above the semiconductor die 108 to draw current from and/or deliver current to the semiconductor die 108. According to an embodiment, the first and second conductive clips 120, 122 have varying width. For example, as shown in FIG. 2A, the first and second conductive clips 120, 122 each include a first section 148 and a second section 150 is wider than the first section 148. The width of these sections 148, 150 is measured in a direction that is perpendicular to a current flow direction of the clip. The first section 148 of each clip extends over and makes contact with the semiconductor die 108. The second section 150 of each clip is exposed from the encapsulant body 124. As a result of this varying width profile, a large electrical contact area is provided at the outside of the package while and a smaller clip footprint is provided within the encapsulant body 124 to accommodate space constraints.

Figure 3:
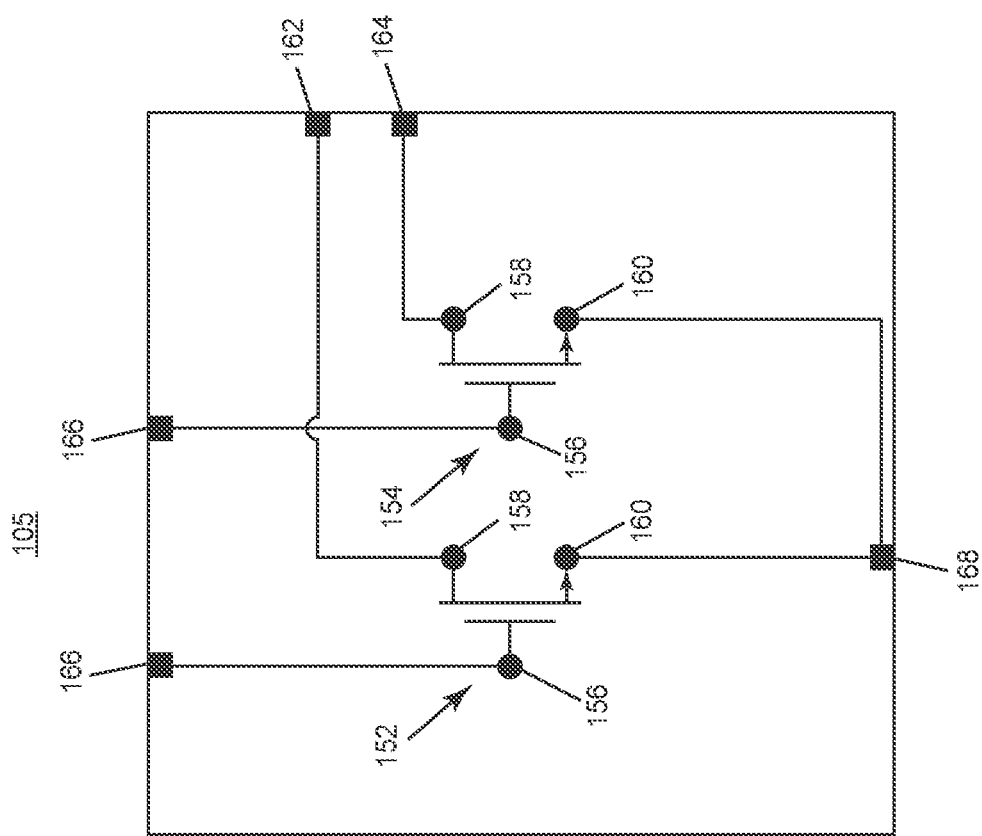
FIG. 3 illustrates a schematic equivalent of a semiconductor die incorporated into the semiconductor package of FIGS. 1-2, according to an embodiment.

Referring to FIG. 3, a schematic equivalent of the semiconductor die 108 is shown, according to an embodiment. In this configuration, the semiconductor die 108 includes a first switching device 152 and a second switching device 154. The first and second switching devices 152, 154 each include a control terminal 156 a first output terminal 158, and a second output terminal 160. In this embodiment, the first and second switching devices 152, 154 are N-channel MOSFET devices, wherein the gate provides the control terminal 156, the drain provides the first output terminal 158, and the source provides the second output terminal 160. In a commonly known manner, these devices are configured to control a current flowing between the source and drain terminals based upon a gate-source bias that exceeds the threshold voltage of the device.

The output signal of the first and second switching devices 152, 154 is accessible at the first and second conductive terminal 114, 116, respectively. As can be seen, the first output terminal 158 of the first switching device 152 is independently connected to a first port 162, which is electrically accessible via the bond pad connection of the first conductive terminal 114. Likewise, the first output terminal 158 of the second switching device 154 is independently connected to a second port 164, which is electrically accessible via the bond pad connection of the second conductive terminal 116. The control terminals 156 of the first and second switching devices 152, 154 are independently connected to additional ports 166 which are electrically accessible via the bond pad connections of the additional conductive terminals 118. The second output terminals 160 of the first and second switching devices 152, 154 may be connected to a third port 168. This third port 168 is electrically accessible via a bond pad connection such e.g., at the rear surface 110 of the semiconductor die 108 in the case of a vertical device.

While the embodiment depicted in FIG. 3 includes only two switching devices, the above described concepts can be extended to a semiconductor die with additional switching devices, i.e., three or more semiconductor devices, and additional output channels, i.e., three or more output channels.

According to an embodiment, the semiconductor die 108 is be configured as a power switching device, i.e., a device that is rated to switch large voltages, e.g., 200V, 400V, 600V, etc. These devices can include power switching devices, such as power MOSFETs (metal-oxide-semiconductor field-effect-transistors), IGBTs (Insulated-Gate Bipolar Transistors), HEMTs (high electron mobility transistor) devices. More generally, the semiconductor die 108 can have a wide variety of device configurations. These device configurations include discrete devices such as transistors, diodes, thyristors, etc. These device configurations also include integrated devices such as, controllers, amplifiers, etc. These device configurations include vertical device configurations, i.e., devices which conduct in a direction perpendicular to the upper and lower surfaces 126, 128 of the die, and lateral device configurations, i.e., devices which conduct in a direction parallel to the upper and lower surfaces 126, 128 of the die.

Referring to FIG. 4, the semiconductor package 100 is depicted, according to another embodiment. In this embodiment, the second conductive clip 122 protrudes out of the second side face 134 of the encapsulant body 124. Thus, the outer end 140 of the second conductive clip 122 is exposed from the same side face 130 of the encapsulant body 124 as the outer end 140 of the first conductive clip 120. In this embodiment, the semiconductor package 100 includes a plurality of third conductive leads 170 that each extend away from a third side of the carrier. The third conductive leads 170 are perpendicular to the first and second conductive second leads 142, 144 and protrude out of the fourth side face 138 of the encapsulant body 124. These third conductive leads 170 are electrically connected to terminals on the upper side 112 of the semiconductor die 108 with electrical connections in a similar manner as previously described. One advantage of the package configuration of FIG. 4 is an increased lead count, and hence increased I/O count, due to the provision of densely spaced leads at three sides of the encapsulant body 124.

Referring to FIG. 5, the semiconductor package 100 is depicted, according to another embodiment. In this embodiment, the second conductive clip 122 protrudes out of the third side face 136 of the encapsulant body 124. Thus, the outer end 140 of the second conductive clip 122 is exposed from a different side face of the encapsulant body 124 as the outer end 140 of the first conductive clip 120. In this embodiment, the semiconductor package 100 includes the plurality of third conductive leads 170 configured in the same manner as described with reference to FIG. 4. Hence, the semiconductor package 100 offers an alternative arrangement for the points of electrical access to the various terminals of the semiconductor die 108 in comparison to the embodiment of FIGS. 1-2. The embodiment of FIG. 5 provides the advantage of arranging logic pins more closely together, which can beneficially in prove the layout of a PCB upon which the semiconductor package 100 is mounted.

Referring to FIG. 6, the semiconductor package 100 is depicted, according to another embodiment. In this embodiment; the first conductive clip 120 extends completely across the semiconductor die 108 and is exposed at two side faces of the encapsulant body 124. More particularly, the first conductive clip 120 protrudes out of the second and fourth side faces 134, 138 of the encapsulant body 124. The second conductive clip 122 protrudes out of the third side face 136 of the encapsulant body 124 in a similar manner as the embodiment of FIG. 5. Thus, the outer end 140 of the second conductive clip 122 is exposed from a different side face 130 of the encapsulant body 124 as both outer ends 140 of the first conductive clip 120. One advantage of the package configuration of FIG. 6 is greater flexibility with respect to external connections with the first conductive clip 120, as it is accessible at two sides of the semiconductor package 100.

Referring to FIG. 7, the semiconductor package 100 is depicted, according to another embodiment. In this embodiment, the semiconductor die 108 further con prises a third conductive terminal 172 disposed on the upper side. The third conductive terminal 172 may be a bond pad connection to the output terminal of a further switching device (e.g. drain, collector, etc.) integrated within the semiconductor die 108. The semiconductor package 100 additionally includes a third conductive clip 174. The third conductive clip 174 may be similar or identical to the first and second conductive clips 120, 122 as described herein. The third conductive clip 174 extends over the upper side 112 of the semiconductor die 108 and is electrically connected to the third conductive terminal 172 in a similar manner as previously described with reference to the first and second conductive clips 120, 122. The third conductive clip 174 protrudes out of the fourth side face 13/of the encapsulant body 124. The second conductive clip 122 protrudes out of the third side face 136 of the encapsulant body 124 in a similar manner as previously described. As a result, the outer end 140 of the third conductive clip 174 provides a point of external electrical contact for the third conductive terminal 172 at different side faces than the outer ends 140 of the first and second conductive clips 120, 122.

Referring to FIG. 8, the semiconductor package 100 is depicted, according to another embodiment. In this embodiment, upper surfaces 176 of the first and second conductive clips 120, 122 that face away from the upper surface 114 of the semiconductor die 108 are exposed from the encapsulant body 124. Moreover, the upper surfaces 176 of the first and second conductive clips 120, 122 are coplanar with the upper surface 126 of the encapsulant body 124. As shown in the plan view configuration of FIG. 8B, the upper surfaces 176 of the first and second conductive clips 120, 122 are surrounded by the encapsulant material at the upper side of the encapsulant body 124. One advantage of the configuration of FIG. 8 is that heat can be radiated away from the package by the exposed upper surfaces 176 of the first and second conductive clips 120, 122 during operation of the device. This effect can be enhanced by placing a heat sink on top of the exposed upper surfaces of the first and second conductive clips 120, 122.

Referring to FIGS. 9-10, selected method steps for producing the semiconductor package 100 are shown.

Figure 9A:
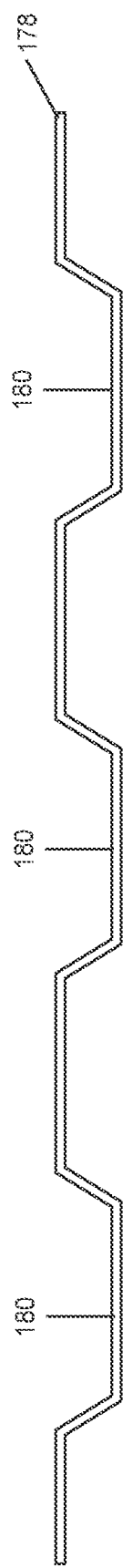
FIGS. 9A, 9B, 9C and 9D, illustrate steps in a method of forming a semiconductor package, according to another embodiment.
Figure 9B:
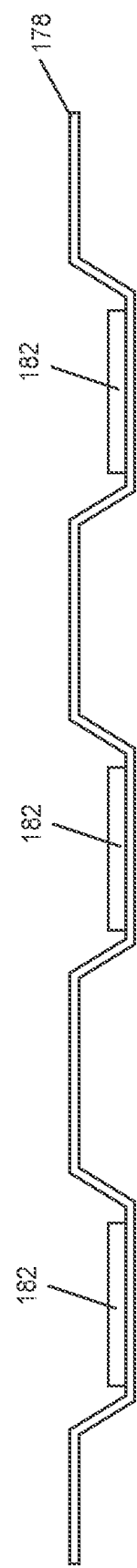
Figure 9C:
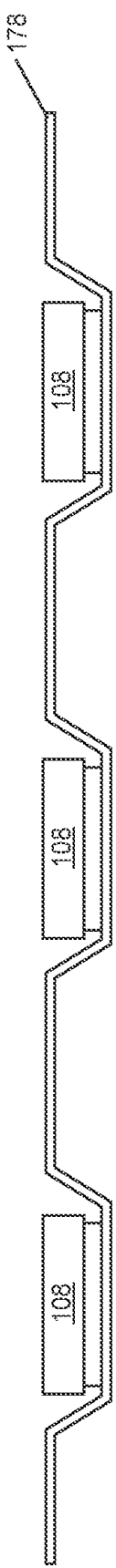
Figure 9D:
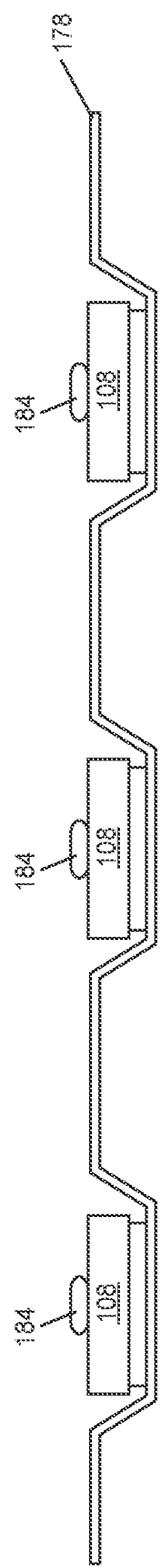

In FIG. 9A, a lead frame 178 is provided. The lead frame 178 includes a plurality of unit lead frames that each contain a die pad 180 and lead configuration for a complete device, e.g., as shown in FIG. 2A. In FIG. 9B, an adhesive 182 is formed on the die attach surface 106 of each unit lead frame. This adhesive can 182 be an electrically insulating tape or glue. Alternatively, the adhesive 182 can be an electrically conductive adhesive, e.g., conductive glue, solder, sinter, etc., if electrical connection between lower surface of the die 108 and the die paddle 102 is required. In FIG. 9C, the semiconductor dies 108 are placed on the adhesive, and are thus attached to the respective die paddle 102 of each lead frame 178. In FIG. 9D, a conductive adhesive 184, e.g., conductive glue, solder, sinter, etc. is placed on the upper side 112 of the semiconductor dies 108. More particularly, the conductive adhesive 182 is provided on the first and second conductive terminals 114, 116 described and shown in the previous figures.

Figure 10A:
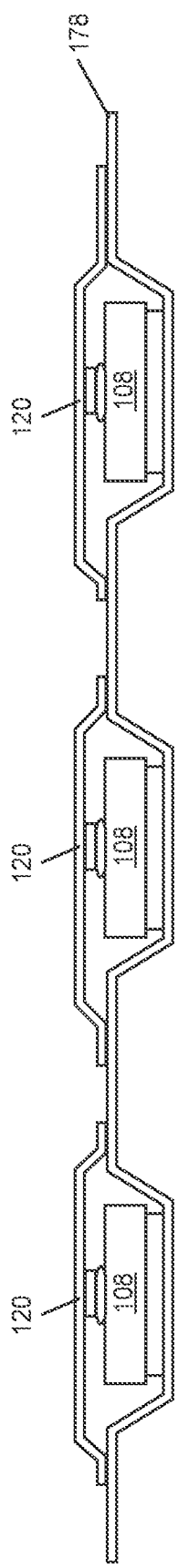
FIGS. 10A, 10B, 10C and 10D, illustrate further steps in the method of forming a semiconductor package, according to another embodiment.
Figure 10B:
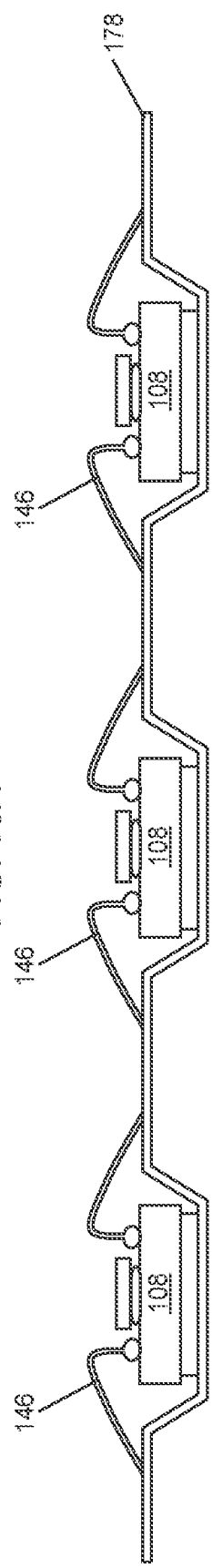
Figure 10C:
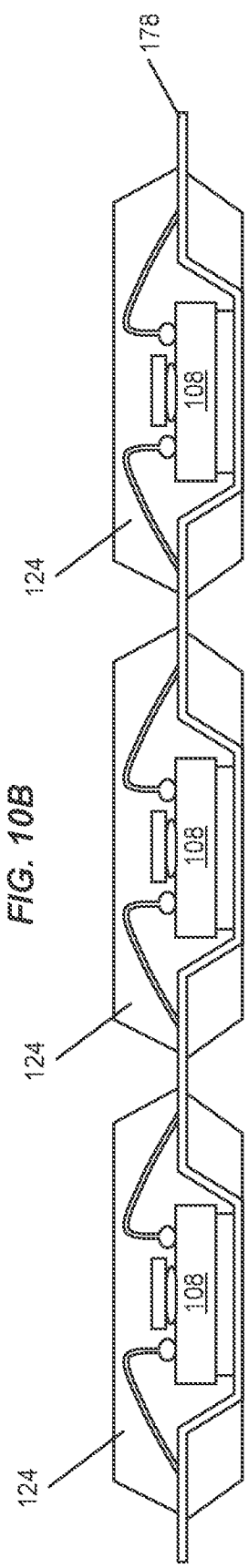
Figure 10D:
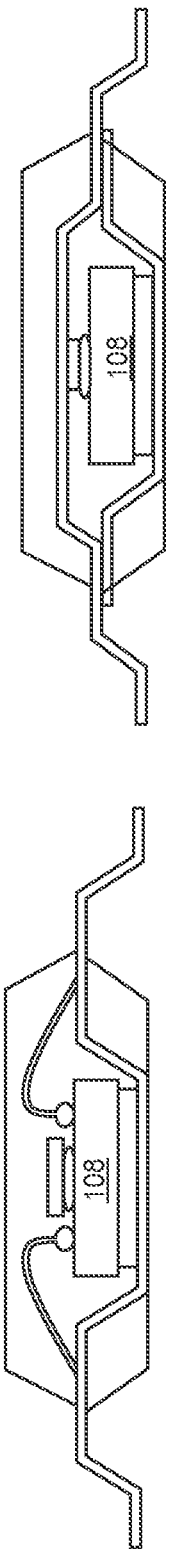

In FIG. 10A, the first conductive clip 120 is attached and electrically connected to the semiconductor die 108. While one clip is shown in this figure for illustration purposes, this technique can be used to attach any one of the first, second and third conductive clips 120, 122, 174 as described herein. In FIG. 10B, the conductive connectors 146 to the additional terminals 118 are formed. The view of FIG. 10B is rotated 90 degrees relative to the view of FIG. 10A. According to an embodiment, the lead frame 178 is rotated about 90 degrees between the clip attachment step of FIG. 10A and the wire bond step of FIG. 10B. In this way, the transverse orientation of the clips and electrical connectors as previously described can be achieved. In FIG. 10C, encapsulant material (e.g., mold compound) is formed on each unit lead frame thereby encapsulating the semiconductor die 108 and associated electrical connections. This can be done according to a variety of known techniques, such as injection molding, transfer molding, compression molding, etc. Before forming the encapsulant material, a lead trimming step (not shown) may be performed to separate at least some of the leads from another and/or from the die paddle 102. Optionally, after forming the encapsulant material, the method may further include removing encapsulant material from the encapsulant body 124 such that the upper surfaces of the first and second conductive clips 120, 122 are exposed and coplanar with an upper surface of the encapsulant body 124, e.g., as shown in FIG. 8. This may be done by a grinding technique, for example. In FIG. 10D, the devices are separated from the lead frame 178, e.g., by mechanical cutting, thereby forming discrete semiconductor packages. Subsequently, lead trimming steps may be performed to separate the leads from the lead frame 178. Additionally, the leads and/or the clips may be bent to provide the desired lead configuration, which in this case is a gull-wing configuration.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A packaged semiconductor device, comprising:
   a carrier comprising a die attach surface;
   a semiconductor die mounted on the die attach surface and comprising first and second conductive terminals disposed on an upper side of the semiconductor die that is opposite from the carrier;
   a first clip that extends over the upper side of the semiconductor die and is electrically connected to the first conductive terminal;
   a second clip that extends over the upper side of the semiconductor die and is electrically connected to the second conductive terminal;
   a plurality of first conductive leads that each extend away from a first side of the carrier; and
   an electrically insulating encapsulant body that encapsulates the semiconductor die,
   wherein an outer end of the first clip is exposed from a side face of the encapsulant body and provides a point of external electrical contact for the first conductive terminal, and
   wherein an outer end of the second clip is exposed from the same or a different side face of the encapsulant body as the outer end of the first clip and provides a point of external electrical contact for the second conductive terminal,
   wherein the first clip is oriented transversely relative the first conductive leads,
   wherein the first conductive leads are configured as logic leads,
   wherein the first conductive leads are electrically connected to the semiconductor die via bond wires.

2. The packaged semiconductor device of claim 1, wherein the semiconductor die further comprises a plurality of additional conductive terminals disposed on the upper side, wherein the packaged semiconductor device further comprises conductive connectors that electrically connect each of the additional conductive terminals respectively to one of the first leads, and wherein the first clip is oriented transversely relative the conductive connectors.

3. The packaged semiconductor device of claim 1, wherein the encapsulant body comprises an upper surface that extends over the upper side of the semiconductor die, a lower surface opposite the upper surface, and first and second side faces that extend between the upper and lower surfaces, wherein the first and second side faces form an angled intersection with one another, wherein each of the first leads protrude out of the first side face, and wherein the first clip protrudes out of the second side face.

4. The packaged semiconductor device of claim 3, wherein the second clip protrudes out of the second side face of the encapsulant body.

5. The packaged semiconductor device of claim 3, wherein the encapsulant body comprises third and fourth side faces that each extend between the upper and lower surfaces, wherein the first, second, third and fourth side faces collectively form a rectangle, and wherein the second clip protrudes out of the third or fourth side faces of the encapsulant body.

6. The packaged semiconductor device of claim 5, further comprising:
   a plurality of second conductive leads that each extend away from a second side of the carrier in an opposite direction as the first conductive leads,
   wherein each of the second conductive leads protrude out of the third side face of the encapsulant body, and
   wherein the second clip protrudes out of the fourth side face of the encapsulant body.

7. The packaged semiconductor device of claim 5, wherein the first clip protrudes out of the second and fourth side faces of the encapsulant body, and wherein the third clip protrudes out of the third side face of the encapsulant body.

8. The packaged semiconductor device of claim 5, further comprising:
   a plurality of third conductive leads that each face and extend away from a third edge side of the carrier,
   wherein the third conductive leads extend perpendicularly to the first conductive leads,
   wherein each of the third leads protrude out of the fourth side face of the encapsulant body, and
   wherein the second clip protrudes out of the third side face of the encapsulant body.

9. The packaged semiconductor device of claim 5, wherein the semiconductor die further comprises a third conductive terminal disposed on the upper side, wherein the packaged semiconductor device further comprises a third clip that extends over the upper side of the semiconductor die and is electrically connected to the third conductive terminal, and wherein the third clip protrudes out of the fourth side face of the encapsulant body.

10. The packaged semiconductor device of claim 3, wherein upper surfaces of the first and second clips that face away from the upper surface of the semiconductor die are completely covered by encapsulant material of the encapsulant body.

11. The packaged semiconductor device of claim 3, wherein upper surfaces of the first and second clips that face away from the upper surface of the semiconductor die are exposed from encapsulant material of the encapsulant body.

12. The packaged semiconductor device of claim 1, wherein the semiconductor die comprises first and second switching devices integrated therein, wherein each of the first and second switching devices comprise a control terminal, a first output terminal, and a second output terminal, wherein the first conductive terminal is a bond pad connection to the first output terminal of the first switching device, and wherein the second conductive terminal is a bond pad connection to the first output terminal of the second switching device.

13. The packaged semiconductor device of claim 12, wherein the first output terminal of the first switching device and the first output terminal of the second switching device are each drain terminals, wherein the second output terminal of the first switching device and the second output terminal of the second switching device are each source terminals, and wherein the second output terminal of the first switching device and the second output terminal of the second switching device each directly face and electrically connect with the carrier.

14. A packaged semiconductor device, comprising:
a carrier comprising a die attach surface;
a semiconductor die mounted on the die attach surface;
an electrically insulating encapsulant body that encapsulates the semiconductor die; and
first and second clips that extend over an upper side of the semiconductor die that is opposite from the carrier and protrude out of side faces of the encapsulant body,
a plurality of first conductive leads that each extend away from a first side of the carrier,
wherein the semiconductor die comprises first and second switching devices integrated therein,
wherein each of the first and second switching devices comprise a control terminal, a first output terminal, and a second output terminal,
wherein the first clip is electrically connected to the first output terminal of the first switching device via a bond pad connection at the upper surface, and
wherein the second clip is electrically connected to the first output terminal of the second switching device via a bond pad connection at the upper surface,
wherein the first clip is oriented transversely relative the first conductive leads,
wherein the first conductive leads are configured as logic leads, and
wherein the first conductive leads are electrically connected to the semiconductor die via bond wires.

15. The packaged semiconductor device of claim 14, further comprising:
electrical connectors connecting the first conductive leads to additional terminals disposed on the upper surface of the semiconductor die,
wherein the first conductive leads protrude out of a different side face of the encapsulant body as the first and second clips,
wherein the first leads provide separate points of external electrical contact for the control terminals of the first and second switching devices, and
wherein the first clip is oriented transversely relative to the electrical connectors.

16. A method of forming a packaged semiconductor device, the method comprising:
providing a carrier comprising a die attach surface and a plurality of first conductive leads that each extend away from a first side of the carrier;
mounting a semiconductor die on the die attach surface such that first and second conductive terminals disposed on an upper side of the semiconductor die that are opposite from the carrier;
providing a first clip that extends over the upper side of the semiconductor die and is electrically connected to the first conductive terminal;
providing a second clip that extends over the upper side of the semiconductor die and is electrically connected to the second conductive terminal; and
attaching the first clip to the first conductive terminal such that the first clip is oriented transversely relative the first conductive leads;
providing an electrically insulating encapsulant body that encapsulates the semiconductor die,
wherein outer ends of the first and second clips are exposed from the encapsulant body,
wherein the first clip is oriented transversely relative the first conductive leads, and
wherein the first conductive leads are configured as logic leads, and
wherein the first conductive leads are electrically connected to the semiconductor die via bond wires.

17. The method of claim 16, wherein the semiconductor die further comprises a plurality of additional conductive terminals disposed on the upper side, wherein the method further comprises:
providing conductive connectors that electrically connect each of the additional conductive terminals respectively to one of the first leads; and
attaching the first clip to the first conductive terminal such that the first clip is oriented transversely relative the conductive connectors.

18. The method of claim 16, wherein providing the encapsulant body comprises completely covering upper surfaces of the first and second clips that face away from the upper surface of the semiconductor die with encapsulant material of the encapsulant body.

19. The method of claim 18, further comprising, after completely covering the upper surfaces of the first and second clips, removing encapsulant material from the encapsulant body such that the upper surfaces of the first and second clips are exposed and coplanar with an upper surface of the encapsulant body.

20. The packaged semiconductor device of claim 1, wherein the first clip comprises a first section and a second section that is wider than the first section, wherein the first section of the first clip extends over the upper side of the semiconductor die, and wherein the second section of the first clip is exposed from the encapsulant body.

21. The packaged semiconductor device of claim 20, wherein the second clip comprises a first section and a second section that is wider than the first section, wherein the first section of the second clip extends over the upper side of the semiconductor die, and wherein the second section of the second clip is exposed from the encapsulant body, and wherein the second sections of the first and second clips are both wider than any other electrically conductive structure that is exposed from the encapsulant body.

22. The packaged semiconductor device of claim 1, wherein the encapsulant body comprises an upper surface that extends over the upper side of the semiconductor die, a lower surface opposite the upper surface, and first, second, third and fourth side faces that each extend between the upper and lower surfaces, wherein the first, second, third and fourth side faces collectively form a rectangle, and wherein the first clip is the only electrically conductive structure that protrudes out of the second side face.

23. The packaged semiconductor device of claim 22, wherein the second clip is the only electrically conductive structure that protrudes out of the fourth side face.

24. The packaged semiconductor device of claim 14, wherein the first clip comprises a first section and a second section that is wider than the first section, wherein the first section of the first clip extends over the upper side of the semiconductor die, and wherein the second section of the first clip is exposed from the encapsulant body.

25. The packaged semiconductor device of claim 24, wherein the second clip comprises a first section and a second section that is wider than the first section, wherein the first section of the second clip extends over the upper side of the semiconductor die, and wherein the second section of the second clip is exposed from the encapsulant body, and wherein the second sections of the first and second clips are both wider than any other electrically conductive structure that is exposed from the encapsulant body.

26. The method of claim 16, wherein the first clip comprises a first section and a second section that is wider than the first section, wherein the first section of the first clip extends over the upper side of the semiconductor die, and wherein the second section of the first clip is exposed from the encapsulant body.

27. The method of claim 26, wherein the second clip comprises a first section and a second section that is wider than the first section, wherein the first section of the second clip extends over the upper side of the semiconductor die, and wherein the second section of the second clip is exposed from the encapsulant body, and wherein the second sections of the first and second clips are both wider than any other electrically conductive structure that is exposed from the encapsulant body.

* * * * *